United States Patent [19]

Geisler

[11] 4,028,563
[45] June 7, 1977

[54] INTEGRATED ZENER DIODE
[75] Inventor: Ulrich Geisler, Gundelfingen-Wildtal, Germany
[73] Assignee: ITT Industries, Inc., New York, N.Y.
[22] Filed: June 25, 1976
[21] Appl. No.: 699,751
[30] Foreign Application Priority Data
July 23, 1975 Germany ............................ 2532847
[52] U.S. Cl. ............................ 307/303; 307/299 A; 307/318; 357/13; 357/36; 357/46
[51] Int. Cl.² ................... H03K 3/26; H01L 29/72; H01L 27/02
[58] Field of Search .............. 307/299 A, 303, 318; 357/13, 36, 46

[56] References Cited
UNITED STATES PATENTS

| 3,523,198 | 8/1970 | Keller | 307/318 |
| 3,567,965 | 3/1971 | Weinerth et al. | 307/303 |
| 3,633,052 | 1/1972 | Hanna | 307/303 |

OTHER PUBLICATIONS
"Adjustable Low–Impedance Zener," by Karash in E.E.E., Apr., 1971, vol. 19, No. 4, Entry 403.
"Hybrid Zener Circuit," by Morgan et al. in IBM Tech. Discl. Bull., vol. 16, No. 9, Feb., 1974, pp. 2908–2909.

Primary Examiner—Stanley D. Miller, Jr.
Attorney, Agent, or Firm—John T. O'Halloran; Peter C. Van Der Sluys; Vincent B. Ingrassia

[57] ABSTRACT

This invention relates to an integrated zener diode having a breakdown voltage of less than about 5 volts. In order to achieve predetermined breakdown voltages within a small gap in the mass production independent of the bulk resistivity fluctuations, the zener diode of the invention comprises a forward-biased control transistor, the base zone of which is fed via a resistor zone to the emitter of said transistor as well as via the collector-emitter-line of a further multi-emitter transistor structure to the collector of said control transistor.

7 Claims, 2 Drawing Figures

INTEGRATED ZENER DIODE

BACKGROUND OF THE INVENTION

This invention relates to an integrated zener diode and, more particularly, to an integrated circuit having a current-voltage characteristic of the conventional pn-zener diode and which is capable of being integrated and assigned to two-polar use. Further, the term zener diode is understood to mean a pn-diode whose breakdown mechanism is governed by the zener breakdown and not by the so-called "avalanche"-effect, hence a pn-diode having a negative temperature coefficient of the breakdown voltage below about 5V. Relative thereto, reference is made to the technical journal "Electronic Industries" (February 1959), pp 78 to 83.

As is well known, zener diodes are classified according to types corresponding to selected zener breakdown voltage ranges. One problem in the mass production is to achieve certain types as desired by customers. In the manufacture of conventional zener diodes, this is accomplished by selecting semiconductor material having a predetermined specific resistance, and is more difficult when tolerances in breakdown voltages are demanded.

SUMMARY OF THE INVENTION

It is the object of the invention, therefore, to reduce the dependency on the tolerances of the specific resistance of the employed semiconductor material.

According to a broad aspect of the invention, there is provided an integrated zener diode, comprising: a first forward-biased load transistor having an emitter, base and collector; a resistor; and a second transistor having a collector, base and a plurality of emitters, the base of said first transistor coupled to the collector of said second transistor and, via said resistor, to the emitter of said first transistor and a first emitter of said plurality of emitters, the collector of said first transistor coupled to a second emitter of said plurality of emitters.

Preferably, the integrated zener diode according to the invention is realized by a planar embodiment of the transistors in an epitapial layer of one conductivity type on a plate-shaped substrate of another conductivity type. This enables the mass production within a semiconductor wafer which is to be divided into the individual integrated zener diodes, by employing photolithographic etching processes and planar diffusion processes which are both carried out on one surface side of the semiconductor wafer.

The above and other objects of the present invention will be more clearly understood from the following detailed description taken in conjunction with the accompanying drawings in which:

DESCRIPTION OF THE PREFERRED EMBODIMENT

Figure 1:
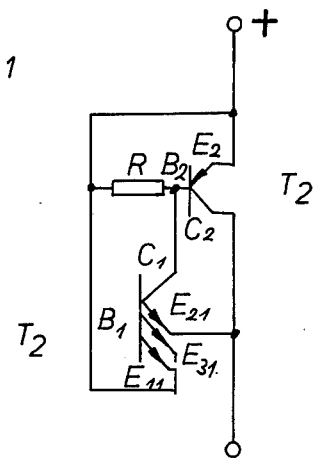
FIG. 1 shows the equivalent circuit diagram of the integrated zener diode according to the invention.

For the zener diode of the invention there is used, as shown in FIG. 1, the emitter-collector path $E_2$, $B_2$, $C_2$ of a load transistor which, according to the plus-sign and the use of a pnp-type transistor $T_2$, is biased in the forward direction. The base of this load transistor $T_2$ is coupled through resistor R, to its own emitter $E_2$. Parallel to resistor R and the collector to the base $B_2$ path of the load transistor $T_1$, there is arranged the emitter-collector path $E_{11}$, $B_1$, $C_1$ of a further transistor $T_1$ which may be considered to be a transistor without a base terminal or as a transistor having an emitter $E_{11}$ serving as the base terminal. Accordingly, there is omitted an ohmic base terminal which would require additional semiconductor surface area.

The base $B_2$ of the load transistor $T_2$ is also connected to the collector $C_2$ of the load transistor $T_2$ via a further emitter-collector path $E_{21}$, $B_1$, $C_1$ biased in the forward direction of transistor $T_1$.

Since the coarse selection during manufacture is carried out during the base diffusion, there is provided for the fine selection of a type of the integrated zener diode corresponding to a constricted tolerance range of the zener voltages in the base zone of the further transistor $T_1$, at least one further emitter or one further emitter zone $E_{31}$ which, just like the emitter $E_{11}$, may be likewise connected to the emitter $E_2$ of the load transistor $T_2$.

Figure 2:
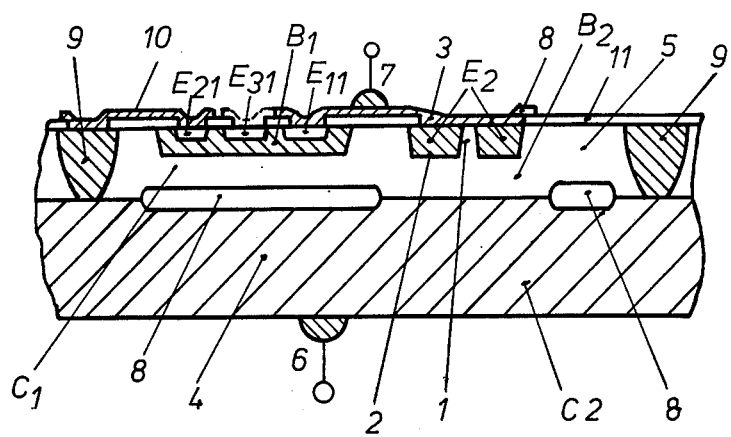
FIG. 2 is a cross sectional view taken vertically in relation to the plane of the wafer through the zones of an integrated zener diode of planar design according to the invention.

For the planar embodiment of the integrated zener diode according to the invention as shown in FIG. 2, the zones of the two transistors $T_1$ and $T_2$ are brought into the epitaxial layer of the one conductivity type by employing the well known planar diffusion process. For this purpose, however, two planar processes are required. During the first planar process the emitter zone $E_2$ of the load transistor $T_2$ is diffused together with the base zone $B_1$ of the further transistor $T_1$, whereas during the second planar process, the emitter zones $E_{11}$, $E_{21}$, $E_{31}$ and, if so required, also further emitter zones are inserted into the base zone $B_1$ of the further transistor $T_1$.

Accordingly, in the planar type of embodiment of the integrated zener diode according to the invention, both the collector zone $C_1$ of the further transistor $T_1$ and the base zone $B_2$ of the load transistor $T_2$ are designed to have the shape of one continuous epitaxial layer 5. The plate-shaped or wafer type substrate 4 is effective below the emitter zone $E_2$ of the load transistor $T_2$ as a collector zone $C_2$ of this load transistor $T_2$, and provided with the ohmic contact 6.

The other ohmic contact 7 which, in a type of embodiment employing a pnp-type load transistor $T_2$ and an npn-type transistor $T_1$, receives the more positive potential, is connected to a contact layer 8 serving to contact the emitter zone $E_2$, the base zone $B_2$ within a frame-like emitter zone $E_2$ of the load transistor $T_2$, and the emitter zone $E_{11}$, as well as in accordance with the type selected, still one or more further emitter zones $E_{31}$, etc. In this way, the resistor R is realized by a semiconducting channel 1 serving as a partial zone of the base zone $B_2$ of the load transistor $T_2$, within the frame-like emitter zone $E_2$ of the load transistor $T_2$ and the contacting layer 3 shortcircuiting the emitter-base junction 2 within the frame-like emitter zone $E_2$. As the material for this contacting layer, it is possible to use e.g. a metal such as aluminum.

Furthermore, in the integrated zener diode according to the invention and on the interface between the epitaxial layer 5 and the substrate 4, there is provided a buried layer of the other conductivity type, hence of the same conductivity type as the epitaxial layer 5, with this layer containing a recess below the emitter $E_2$ of the load transistor $T_2$. Whereas the buried layer 8 below the base zone $B_1$ of the further transistor $T_1$ serves to reduce the collector spreading resistance, this layer has been omitted below the emitter zone $E_2$ of the load transistor $T_2$ where it would otherwise affect the minority charge carrier current.

In addition thereto, the planar embodiment of the integrated zener diode according to the invention as shown in FIG. 2, comprises a surrounding insulating zone 9 of the same conductivity type as that of the substrate, which extends through the epitaxial layer 5. On one hand, this zone serves the purpose of contacting the emitter zone $E_{21}$ of the further transistor $T_1$, via the contact layer 10, to the substrate 4. On the other hand, this insulating zone safeguards that all pn-junctions of the integrated zener diode remain protected by the surface protecting layer 11. Because after splitting or dividing the semiconductor wafer, the lateral junction between the substrate 4 and the epitaxial layer 5 would otherwise end at a surface disturbed in its crystal lattice.

Of course, the integrated zener diode according to the invention may also be realized in mesa form, as instead, the place of the insulating zone 9 will be taken by the circumferential area of a mesa carrying the contacting layer 10 on an insulating protective layer.

For effecting the above mentioned fine selection, still further emitter zones, such as $E_{31}$, of the further transistor $T_1$ are preferably provided which are contacted with the emitter zone $E_2$ of the load transistor $T_2$ in accordance with the respective type to be manufactured. The fine adjustment in connection with selecting the types, is carried out via the setting of the surface area relationship of the total surface area of all emitters connected to the emitter zone $E_2$ of the load transistor $T_2$ in relation to the surface of the emitter zone $E_{21}$ of the further transistor $T_1$, which is contacted to the collector $C_2$ of the load transistor $T_2$. In practice, this will result approximately in a variation of the zener voltage of about 0.8V when changing this surface area relationship by the factor 4.

However, the coarse adjustment is carried out during the base diffusion via the surface concentration. This surface concentration, in fact, is determinative of the breakdown voltage of the emitter zones of the further transistor $T_1$ as connected to the emitter zone $E_2$ of the load transistor $T_2$ and which, unlike the emitter zone $E_{21}$ as connected to the collector zone $C_2$ of the load transistor $T_2$, are operated in the reverse direction.

It is considered an advantage that the differential resistance of the integrated zener diode according to the invention is chiefly dependent upon the current dependence of the current gain factor of the transistors, and not upon the zener voltage of pn-junctions operated in the reverse direction. From this there results the advantage of obtaining a differential resistance which is reduced by about the factor 3, as compared to conventional, non-integrated zener diodes.

While the principles of this invention have been described above in connection with specific apparatus, it is to be understood that this description is made only by way of example and not as a limitation on the scope of the invention as set forth in the objects and features thereof and in the accompanying claims.

What is claimed is:
1. An integrated zener diode, comprising:
   a first forward-biased load transistor having an emitter, base and collector;
   a resistor; and
   a second transistor having a collector, base and a plurality of emitters, the base of said first transistor coupled to the collector of said second transistor and, via said resistor, to the emitter of said first transistor and a first emitter of said plurality of emitters, the collector of said first transistor coupled to a second emitter of said plurality of emitters.
2. An integrated zener diode according to claim 1, comprising:
   a semiconductive substrate of a first conductivity type; and
   an epitaxial layer of a second conductivity disposed on said substrate, said first and second transistors disposed within said epitaxial layer.
3. An integrated zener diode according to claim 2, comprising:
   a plurality of regions of said first conductivity type disposed within said epitaxial layer for forming the emitter of said first transistor;
   a first region of said first conductivity type disposed within said epitaxial layer for forming the base of said second transistor; and
   a plurality of regions of said second conductivity type disposed within said first region for forming said plurality of emitters.
4. An integrated zener diode according to claim 3 further comprising a buried layer of said second conductivity type arranged on the interface between said epitaxial layer and said substrate, said buried layer having an opening therein below the emitter of said first transistor.
5. An integrated zener diode according to claim 4 wherein the emitter of said first transistor is a frame-like zone in said epitaxial layer having a semiconducting channel therethrough, said semiconducting channel comprising a portion of said epitaxial layer and said epitaxial layer forming the base of said first transistor, and wherein a contacting layer short-circuits said semiconducting channel and said frame-like zone.
6. An integrated zener diode according to claim 5 wherein said second transistor includes a third emitter region contacted by the emitter region of said first transistor.
7. An integrated zener diode according to claim 6 further including an insulating zone having said first type conductivity surrounding said first and second transistors and extending through said epitaxial layer.

* * * * *